United States Patent
Taniguchi et al.

(10) Patent No.: US 12,244,296 B2
(45) Date of Patent: Mar. 4, 2025

(54) ACOUSTIC WAVE FILTER

(71) Applicant: Murata Manufacturing Co., Ltd., Nagaokakyo (JP)

(72) Inventors: Yasumasa Taniguchi, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 394 days.

(21) Appl. No.: 17/701,969

(22) Filed: Mar. 23, 2022

(65) Prior Publication Data
US 2022/0216853 A1 Jul. 7, 2022

Related U.S. Application Data

(63) Continuation of application No. PCT/JP2020/035303, filed on Sep. 17, 2020.

(30) Foreign Application Priority Data

Sep. 27, 2019 (JP) .................................. 2019-176704

(51) Int. Cl.
- *H03H 9/56* (2006.01)
- *H03H 9/02* (2006.01)
- *H03H 9/205* (2006.01)

(52) U.S. Cl.
CPC ........ *H03H 9/568* (2013.01); *H03H 9/02228* (2013.01); *H03H 9/205* (2013.01)

(58) Field of Classification Search
CPC .. H03H 9/205; H03H 9/02574; H03H 9/1457; H03H 9/02228; H03H 9/568; H03H 9/02881
See application file for complete search history.

(56) References Cited

U.S. PATENT DOCUMENTS

| | | | |
|---|---|---|---|
| 2003/0117240 A1* | 6/2003 | Inoue | H03H 9/6436 333/195 |
| 2010/0194496 A1* | 8/2010 | Goto | H03H 9/0071 333/195 |

(Continued)

FOREIGN PATENT DOCUMENTS

| | | |
|---|---|---|
| JP | 2002-217680 A | 8/2002 |
| JP | 2010-251889 A | 11/2010 |

(Continued)

OTHER PUBLICATIONS

Official Communication issued in International Patent Application No. PCT/JP2020/035303, mailed on Nov. 17, 2020.

*Primary Examiner* — Daniel L Murphy
*Assistant Examiner* — Amie M Ndure
(74) *Attorney, Agent, or Firm* — Keating & Bennett, LLP

(57) ABSTRACT

An acoustic wave filter includes acoustic wave resonators including a piezoelectric substrate and an IDT electrode including first and second electrode fingers. An intersecting region of the first and second electrode fingers includes a central region and first and second edge regions on outer side portions of the central region. An acoustic velocity in the first and second edge regions is lower than that in the central region, and the acoustic wave resonators include a first acoustic wave resonator with a width in the first and second edge regions larger than a width in the central region, and a second acoustic wave resonator including at least one of an acoustic velocity reducing film and an acoustic velocity increasing film in the central region, such that an acoustic velocity in the first and second edge regions is lower than acoustic velocity in the center region.

18 Claims, 8 Drawing Sheets

(56) References Cited

U.S. PATENT DOCUMENTS

| | | | |
|---|---|---|---|
| 2011/0068655 A1* | 3/2011 | Solal | H03H 9/02858 |
| | | | 310/313 B |
| 2012/0161577 A1* | 6/2012 | Abbott | H03H 9/02724 |
| | | | 310/313 C |
| 2013/0051588 A1* | 2/2013 | Ruile | H03H 9/1457 |
| | | | 29/25.35 |
| 2015/0180451 A1* | 6/2015 | Nakazawa | H03H 9/02952 |
| | | | 333/195 |
| 2017/0222622 A1* | 8/2017 | Solal | H03H 9/02574 |
| 2017/0264262 A1* | 9/2017 | Nakazawa | H03H 9/64 |
| 2017/0373669 A1* | 12/2017 | Iwaki | H03H 9/1457 |
| 2018/0019730 A1* | 1/2018 | Takeuchi | H03H 9/72 |
| 2018/0034443 A1* | 2/2018 | Nakazawa | H03H 9/14541 |
| 2018/0097508 A1* | 4/2018 | Iwamoto | H03H 9/6496 |
| 2018/0109238 A1* | 4/2018 | Yamaji | H03H 9/6493 |
| 2018/0109242 A1* | 4/2018 | Solal | H03H 9/02866 |
| 2018/0254766 A1* | 9/2018 | Shimozono | H03H 9/605 |
| 2018/0323769 A1* | 11/2018 | Yamamoto | H03H 9/6483 |
| 2018/0375491 A1* | 12/2018 | Iwaki | H03H 9/02858 |
| 2019/0074813 A1* | 3/2019 | Zou | H03H 9/562 |
| 2019/0158059 A1* | 5/2019 | Taniguchi | H03H 9/02858 |
| 2019/0222198 A1* | 7/2019 | Tsukamoto | H03H 9/6403 |
| 2019/0260348 A1* | 8/2019 | Hiratsuka | H03H 9/14538 |
| 2019/0267966 A1* | 8/2019 | Hiratsuka | H03H 9/02574 |
| 2019/0267969 A1* | 8/2019 | Tsukamoto | H03H 9/6403 |
| 2020/0106469 A1* | 4/2020 | Kimura | H03H 9/725 |
| 2020/0119711 A1* | 4/2020 | Kadota | H03H 9/02551 |
| 2020/0252045 A1* | 8/2020 | Solal | H03H 9/1457 |
| 2020/0259480 A1* | 8/2020 | Pensala | H03H 9/02228 |
| 2020/0295735 A1* | 9/2020 | Takata | H03H 9/02574 |

FOREIGN PATENT DOCUMENTS

| | | |
|---|---|---|
| JP | 2013-518455 A | 5/2013 |
| JP | 2014-131351 A | 7/2014 |
| WO | 2016/208446 A1 | 12/2016 |
| WO | 2018/051597 A1 | 3/2018 |

* cited by examiner

ACOUSTIC WAVE FILTER

CROSS REFERENCE TO RELATED APPLICATIONS

This application claims the benefit of priority to Japanese Patent Application No. 2019-176704 filed on Sep. 27, 2019 and is a Continuation Application of PCT Application No. PCT/JP2020/035303 filed on Sep. 17, 2020. The entire contents of each application are hereby incorporated herein by reference.

BACKGROUND OF THE INVENTION

1. Field of the Invention

The present invention relates to a band-pass acoustic wave filter including a plurality of acoustic wave resonators.

2. Description of Related Art

Various band-pass acoustic wave filters including a plurality of acoustic wave resonators have been proposed. For example, in a ladder filter described in Japanese Unexamined Patent Application Publication No. 2002-217680, a series arm resonator and a parallel arm resonator are configured with acoustic wave resonators.

In addition, Japanese Unexamined Patent Application Publication No. 2014-131351 discloses a structure in which a piston mode is formed in an acoustic wave resonator and transverse mode ripples are suppressed. More specifically, in an IDT electrode, a region where electrode fingers each connected to different potential overlap each other in an acoustic wave propagation direction is referred to as an intersecting region. The intersecting region includes a central region located at a center in a direction orthogonal to the acoustic wave propagation direction and includes first and second edge regions provided on respective sides of the central region in the direction orthogonal to the acoustic wave propagation direction. The piston mode is generated by making an acoustic velocity in the first and second edge regions lower than an acoustic velocity in the central region.

As the structure for providing the acoustic velocity difference, 1) a structure having a widened portion in which a width in each of the first and second edge regions is wider than that in the central region or 2) a structure in which an acoustic velocity reducing film is laminated in the first and second edge regions are disclosed.

When the structure described in Japanese Unexamined Patent Application Publication No. 2014-131351 in which the piston mode is used is applied to an acoustic wave filter including a plurality of acoustic wave resonators as described in Japanese Unexamined Patent Application Publication No. 2002-217680, it is possible to suppress ripples due to a transverse mode. However, when the structure in which the first and second edge regions are the widened portions is used in each of the acoustic wave resonators of the acoustic wave filter and particularly when a reduction in size of the acoustic wave filter is attempted, ripples due to a transverse mode cannot be sufficiently suppressed in some cases. In addition, when the structure in which the acoustic velocity reducing film is laminated in the first and second edge regions is used in each of the acoustic wave resonator, there has been a case in which steepness of filter characteristics at a pass band end portion of the acoustic wave filter is not sufficiently high.

SUMMARY OF THE INVENTION

Preferred embodiments of the present invention provide acoustic wave filters that are each able to reduce or prevent ripples in a transverse mode and improve steepness of filter characteristics, even when a reduction in size is achieved.

An acoustic wave filter according to a preferred embodiment of the present invention includes a plurality of acoustic wave resonators including a piezoelectric substrate and an IDT electrode on the piezoelectric substrate and including first and second electrode fingers interdigitated with each other. When a region in which the first electrode fingers and the second electrode fingers overlap each other in an acoustic wave propagation direction is defined as an intersecting region, the intersecting region includes a central region at a center or approximate center in a direction in which the first and second electrode fingers extend and first and second edge regions on respective outer side portions of the central region in a direction in which the first and second electrode fingers extend, and an acoustic velocity in the first and second edge regions is lower than an acoustic velocity in the central region. The plurality of acoustic wave resonators include a first acoustic wave resonator in which at least one of a width of the first electrode fingers and a width of the second electrode fingers in the first and second edge regions is larger than at least one of a width of first electrode fingers and a width of second electrode fingers in the central region, and a second acoustic wave resonator including at least one of a configuration in which an acoustic velocity reducing film is laminated in the first and second edge regions and a configuration in which an acoustic velocity increasing film to increase the acoustic velocity is laminated in the central region.

An acoustic wave filter according to a preferred embodiment of the present invention includes a plurality of acoustic wave resonators including a piezoelectric substrate and an IDT electrode on the piezoelectric substrate and including first and second electrode fingers interdigitated with each other. When a region in which the first electrode fingers and the second electrode fingers overlap each other in an acoustic wave propagation direction is defined as an intersecting region, the intersecting region includes a central region at a center or approximate center in a direction in which the first and second electrode fingers extend and first and second edge regions on respective outer side portions of the central region in a direction in which the first and second electrode fingers extend, and an acoustic velocity in the first and second edge regions is lower than acoustic velocity in the central region. The plurality of acoustic wave resonators include a first acoustic wave resonator in which at least one of a width of the first electrode fingers and a width of the second electrode fingers in the first and second edge regions is larger than at least one of a width of the first electrode fingers and a width of the second electrode fingers in the central region, and a second acoustic wave resonator including at least one of a configuration in which an insulating film made of tantalum pentoxide, hafnium oxide, niobium pentoxide, tungsten oxide, and silicon oxide, or Al, Cu, Pt, Au, Ag, Ti, Ni, Cr, Mo, W, Ta, Mg, Fe, or Ru or alloy mainly including any of Al, Cu, Pt, Au, Ag, Ti, Ni, Cr, Mo, W, Ta, Mg, Fe, or Ru is laminated in the first and second edge regions and a configuration in which a film made of a material selected from the group consisting of aluminum oxide, aluminum nitride, silicon nitride, and silicon oxide is laminated in the central region.

According to preferred embodiments of the present invention, acoustic wave filters can be provided that are each able to reduce or prevent transverse mode ripples and improve steepness of filter characteristics, even when a reduction in size is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the accompanying drawings.

Each of the preferred embodiments described in the present specification is illustrative, and partial replacement or combination of configurations between different preferred embodiments is possible.

Figure 1:
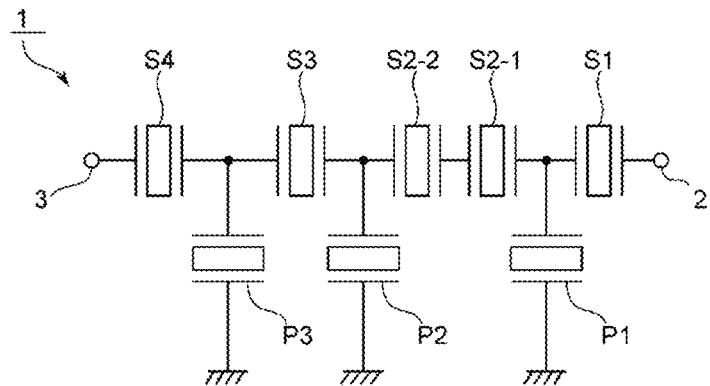
FIG. 1 is a circuit diagram of an acoustic wave filter according to a first preferred embodiment of the present invention.

FIG. 1 is a circuit diagram of an acoustic wave filter according to a first preferred embodiment of the present invention. An acoustic wave filter 1 is, for example, a ladder filter including a plurality of acoustic wave resonators. In the acoustic wave filter 1, a plurality of series arm resonators S1, S2-1, S2-2, S3, and S4 are provided in a series arm connecting an input terminal 2 and an output terminal 3. Further, a plurality of parallel arms connecting the series arm and ground potential is provided. In the respective parallel arms, parallel arm resonators P1, P2, and P3 are provided.

Each of the series arm resonators S1, S2-1, S2-2, S3, S4 and the parallel arm resonators P1 to P3 is defined by an acoustic wave resonator.

In the acoustic wave filter 1, the plurality of acoustic wave resonators include a first acoustic wave resonator and a second acoustic wave resonator described below. The plurality of acoustic wave resonators may include an acoustic wave resonator having a structure different from the structure of the first acoustic wave resonator and the structure of the second acoustic wave resonator.

The first and second acoustic wave resonators have a structure to produce a piston mode and to reduce or prevent transverse mode ripples. The acoustic wave resonator includes a piezoelectric substrate and an IDT electrode on the piezoelectric substrate. In the present specification, a region where first electrode fingers and second electrode fingers of the IDT electrode overlap each other in an acoustic wave propagation direction is referred to as an intersecting region. The intersecting region includes a central region located at a center or approximate center in a direction in which the first and second electrode fingers extend, and first and second edge regions on respective outer side portions of the central region in the direction in which the first and second electrode fingers extend. In the first and second acoustic wave resonators, an acoustic velocity in the first and second edge regions is lower than an acoustic velocity in the central region. Thus, the piston mode is produced, and the transverse mode ripples are reduced or prevented.

In order to achieve an acoustic velocity difference between the acoustic velocity in the central region and the acoustic velocity in the first and second edge regions, the first and second acoustic wave resonators have structures as described below.

In the first acoustic wave resonator, a width of each of the first and second electrode fingers in the first and second edge regions is larger than a width of each of the first and second electrode fingers in the central region. That is, the first and second edge regions are widened portions. In a preferred embodiment of the present invention, it is sufficient that at least one of the width of the first electrode fingers and the width of the second electrode fingers in the first and second edge regions is larger than at least one of the width of the first electrode fingers and the width of the second electrode fingers in the central region.

On the other hand, the second acoustic wave resonator includes, so that the acoustic velocity in the first and second edge regions is lower than the acoustic velocity in the central region, at least one of a configuration in which an acoustic velocity reducing film is laminated in the first and second edge regions and a configuration in which an acoustic velocity increasing film that increases acoustic velocity is laminated on the central region.

As described above, the first acoustic wave resonator and the second acoustic wave resonator are different from each other in the configuration to achieve the acoustic velocity difference between the acoustic velocity in the first and second edge regions and the acoustic velocity in the central region. This will be described in more detail below.

Figure 2A:
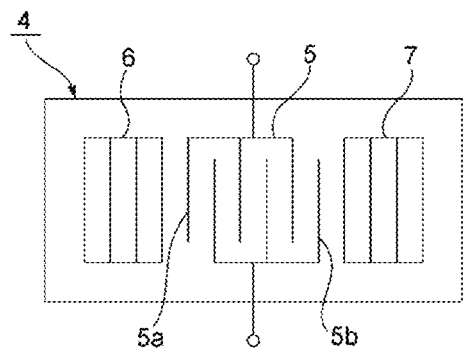
FIG. 2A is a schematic plan view illustrating electrode structure of an acoustic wave resonator of the acoustic wave filter of the first preferred embodiment of the present invention.
Figure 2B:
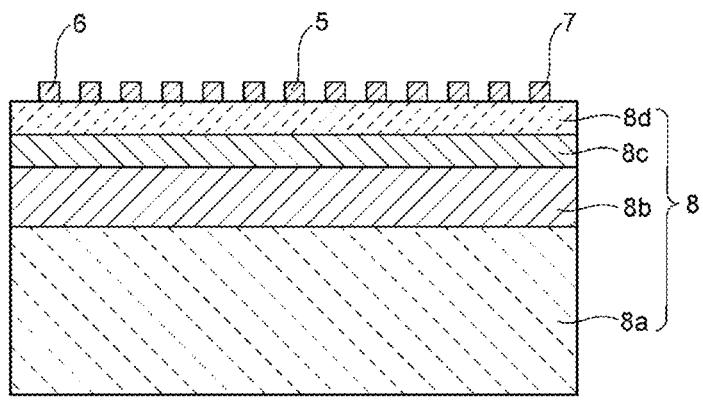
FIG. 2B is a front sectional view of the acoustic wave resonator.

FIG. 2A is a schematic plan view illustrating an electrode structure of the acoustic wave resonator of the acoustic wave filter of the first preferred embodiment, and FIG. 2B is a front sectional view thereof. The series arm resonators S1, S2-1, S2-2, S3, and S4 and the parallel arm resonators P1, P2, and P3 described above all have such a structure.

As illustrated in FIG. 2A, an acoustic wave resonator 4 includes an IDT electrode 5 and reflectors 6 and 7. Thus, a one-port acoustic wave resonator is configured.

The IDT electrode 5 includes a plurality of first electrode fingers 5a and a plurality of second electrode fingers 5b. The plurality of first electrode fingers 5a and the plurality of second electrode fingers 5b are interdigitated with each other. A direction orthogonal or substantially orthogonal to a direction in which the first electrode fingers 5a and the second electrode fingers 5b extend is the acoustic wave propagation direction. When viewed in the acoustic wave propagation direction, a region where the first electrode fingers 5a and the second electrode fingers 5b overlap each other is the intersecting region.

As illustrated in FIG. 2B, in the acoustic wave resonator 4, the IDT electrode 5 and the reflectors 6 and 7 are provided on a piezoelectric substrate 8. Here, the piezoelectric substrate 8 is not particularly limited, but is, for example, a laminated substrate including a support substrate 8a, a high acoustic velocity material layer 8b, a low acoustic velocity film 8c, and a piezoelectric film 8d. However, the piezoelectric substrate 8 may be, for example, a single piezoelectric substrate made of $LiNbO_3$ or the like.

In the present preferred embodiment, the piezoelectric film 8d is made of, for example, $LiTaO_3$. The support substrate 8a is made of an appropriate insulating material or semiconductor material such as, for example, Si or alumina. In the present preferred embodiment, the support substrate 8a is made of, for example, Si.

The high acoustic velocity material layer 8b is made of a high acoustic velocity material. Here, the high acoustic velocity material refers to a material in which acoustic velocity of a bulk wave propagating therethrough is higher than acoustic velocity of an acoustic wave propagating through the piezoelectric film 8d. As the high acoustic velocity material, various materials can be used such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC (diamond-like carbon) film, or diamond, a medium including the above material as a main component, or a medium including a mixture of the above materials as a main component.

The low acoustic velocity film 8c is made of a low acoustic velocity material. Here, the low acoustic velocity material refers to a material in which acoustic velocity of a bulk wave propagating therethrough is lower than acoustic velocity of a bulk wave propagating through the piezoelectric film 8d. As the low acoustic velocity material, various materials can be used such as, for example, silicon oxide, glass, silicon oxynitride, tantalum oxide, or a compound obtained by adding fluorine, carbon, boron, hydrogen, or a silanol group to silicon oxide, or a medium including the above material as a main component.

By using the piezoelectric substrate 8 made of the composite substrate described above, a Q factor can be increased.

Although the piezoelectric substrate 8 including the high acoustic velocity material layer 8b is used in FIG. 2B, a support substrate made of a high acoustic velocity material may be used instead of the high acoustic velocity material layer 8b and the support substrate 8a. That is, the support substrate 8a and the high acoustic velocity material layer 8b may be integrally made of a high acoustic velocity material.

Further, the low acoustic velocity film 8c need not be provided. That is, the piezoelectric film 8d may be directly laminated on the high acoustic velocity material layer 8b.

As described above, the first acoustic wave resonator and the second acoustic wave resonator are used in the present invention.

In the acoustic wave filter 1 according to the first preferred embodiment, the series arm resonator S3 is defined by the first acoustic wave resonator. The rest of the acoustic wave resonators, that is, the series arm resonators S1, S2-1, S2-2, and S4 and the parallel arm resonators P1 to P3 are defined by the second acoustic wave resonators.

An acoustic wave resonator described below was prepared as the first acoustic wave resonator.

The piezoelectric substrate 8 has laminated structure including, on a Si substrate, a silicon nitride film as the high acoustic velocity material layer 8b, a silicon oxide film as the low acoustic velocity film 8c, and a $LiTaO_3$ film as the piezoelectric film 8d, and thicknesses were set such that, for example, the silicon nitride film=about 900 nm, the silicon oxide film=about 673 nm, and the $LiTaO_3$ film=about 600 nm. The IDT electrode 5 and the reflectors 6 and 7 include a main electrode layer made of, for example Al. A thickness of an Al film was, for example, about 145 nm.

Figure 3:
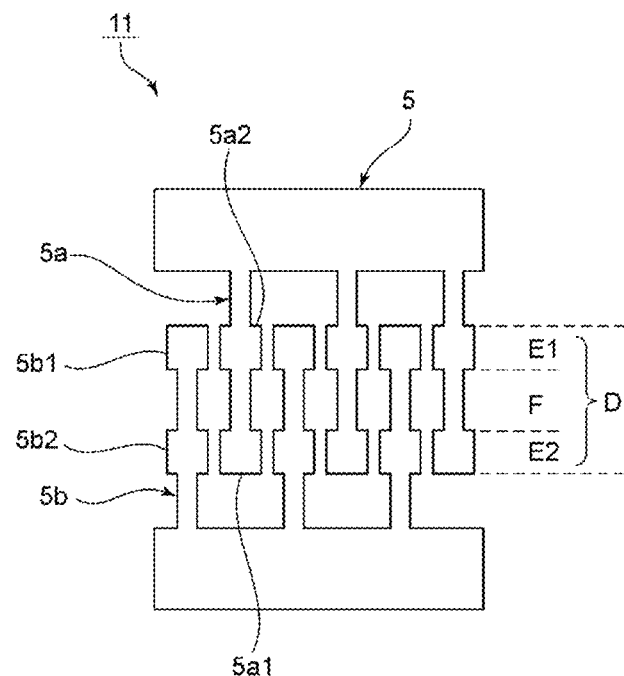
FIG. 3 is a plan view for explaining an IDT electrode of a first acoustic wave resonator.

The electrode structure 11 of the IDT electrode in the first acoustic wave resonator is illustrated as a plan view in FIG. 3. In the IDT electrode 5, an intersecting region D includes a central region F and first and second edge regions E1 and E2. In the first and second edge regions E1 and E2, the first electrode fingers 5a and the second electrode fingers 5b include widened portions 5a1, 5a2, 5b1, and 5b2. A width of each of the widened portions 5a1, 5a2, 5b1, and 5b2 is larger than a width in the central region F. Here, the width refers to a dimension along the acoustic wave propagation direction in the first and second electrode fingers 5a and 5b.

In the first acoustic wave resonator, a wavelength λ determined by an electrode finger pitch in the central region of the IDT electrode was set to, for example, about 2 μm. Further, a duty in the central region was set to, for example, about 0.45. A duty in the first and second edge regions was set to, for example, about 0.73.

In the first acoustic wave resonator, the duty of the central region F is, for example, about 0.45, and in the second acoustic wave resonator, duty of the central region F is, for example, about 0.5. In the first acoustic wave resonator and the second acoustic wave resonator, capacitance is adjusted by reducing an interdigitation width.

Figure 4:
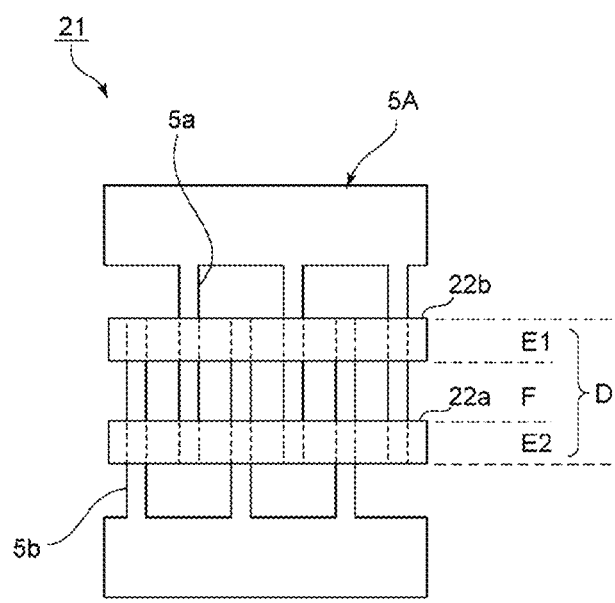
FIG. 4 is a plan view for explaining electrode structure of an IDT electrode of a second acoustic wave resonator.

FIG. 4 is a plan view for explaining the electrode structure 21 of an IDT electrode of the second acoustic wave resonator. The second acoustic wave resonator was configured similarly to the first acoustic wave resonator except that the electrode structure of the IDT electrode was different. As illustrated in FIG. 4, in an IDT electrode 5A, acoustic velocity reducing films 22b and 22a are laminated in the first and second edge regions E1 and E2, respectively. The acoustic velocity reducing films 22b and 22a are provided in the first and second edge regions E1 and E2, respectively, so as to extend along the acoustic wave propagation direction. The acoustic velocity reducing films 22a and 22b here are made of, for example, tantalum pentoxide. The acoustic velocity reducing films 22a and 22b may be made of other insulating materials as long as the materials add mass and reduce acoustic velocity. Further, when provided so as not to short-circuit the first and second electrode fingers 5a and 5b, the acoustic velocity reducing films 22a and 22b may be made of, for example, metal or the like.

In the second acoustic wave resonator, a wavelength of the IDT electrode was set to, for example, about 2 μm, and duty in the central region and the first and second edge regions was set to, for example, about 0.50.

Resonance characteristics of the first acoustic wave resonator and the second acoustic wave resonator will be described with reference to FIGS. 5A and 5B.

Figure 5A:
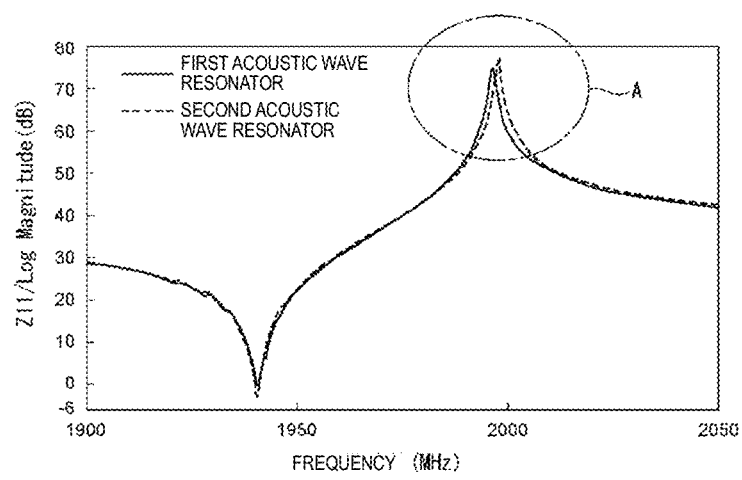
FIG. 5A is a diagram showing resonance characteristics of the first and second acoustic wave resonators.

In FIG. 5A, a solid line indicates the resonance characteristics of the first acoustic wave resonator, and a broken line indicates the resonance characteristics of the second acoustic wave resonator. FIG. 5B is an enlarged diagram illustrating a portion indicated by a circle A in FIG. 5A.

Compared to the first acoustic wave resonator, in the second acoustic wave resonator, it is not necessary to provide a widened portion in the first or second electrode fingers. Thus, even when the duty in the central region is increased, it is easy to increase an acoustic velocity difference between the first and second edge regions and the central region. When the duty in the central region is increased, capacitance between the first electrode fingers and the second electrode fingers is increased. Thus, a reduction in size of the acoustic wave resonator can be achieved. Compared to this, in the first acoustic wave resonator, when the duty in the central region is increased, it is difficult to increase the acoustic velocity difference between the first and second edge regions and the central region. Thus, the second acoustic wave resonator can be designed so as to make duty in the central region larger while maintaining the acoustic velocity difference between the first and second edge regions and the central region. Thus, the second acoustic wave resonator is more likely to achieve a reduction in size of the acoustic wave resonator and a reduction in size of the acoustic wave filter including the acoustic wave resonator while reducing or preventing transverse mode ripples.

Figure 5B:
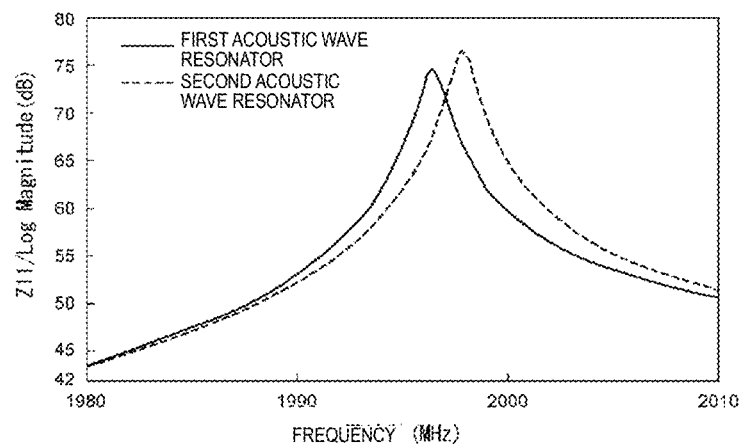
FIG. 5B is an enlarged diagram showing a portion indicated by a circle A in FIG. 5A.

However, as shown in FIGS. 5A and 5B, a fractional bandwidth of the second acoustic wave resonator is larger compared to that of the first acoustic wave resonator. Thus, when an acoustic wave filter configured only with the second acoustic wave resonator, for example, a ladder filter is configured, there was a problem in that steepness of filter characteristics was insufficient. In order to improve the steepness, it is conceivable to weight the IDT electrode. However, in this case, there is a problem in that bandpass characteristics deteriorate.

As shown in FIG. 5A, the fractional bandwidth of the second acoustic wave resonator is about 3.9%, whereas the fractional bandwidth of the first acoustic wave resonator is about 3.8%. That is, the second acoustic wave resonator has the larger fractional bandwidth.

When the duty in the central region is decreased, the fractional bandwidth is generally increased. When the duty in the central region is increased, the fractional bandwidth is generally decreased. In the first acoustic wave resonator, although the duty in the central region is smaller compared to the second acoustic wave resonator, the fractional bandwidth is smaller. That is, the first acoustic wave resonator has a disadvantage for reduction or prevention of the transverse mode ripples compared to the second acoustic wave resonator, but the fractional bandwidth is easily made smaller compared to the second acoustic wave resonator. Thus, by using the first acoustic wave resonator, the fractional bandwidth can be narrowed and the steepness of the filter characteristics can be increased. On the other hand, by using the second acoustic wave resonator, the transverse mode ripples can be effectively reduced or prevented even when a reduction in size of the acoustic wave filter is achieved.

That is, since the acoustic wave filter of the present preferred embodiment includes the first acoustic wave resonator and the second acoustic wave resonator, it is possible to reduce or prevent the transverse mode ripples and improve in steepness of the filter characteristics, even when a reduction in size is achieved. This will be described based on specific examples.

As described above, preferably, the duty in the central region of the IDT electrode in the second acoustic wave resonator is larger than the duty in the central region of the IDT electrode in the first acoustic wave resonator. Thus, a reduction in size can be effectively achieved.

Example 1 and Comparative Example 1

Acoustic wave filters of Example 1 of the acoustic wave filter 1 illustrated in FIG. 1 and Comparative Example 1 for comparison were prepared. A configuration of the piezoelectric substrate 8 in Example 1 was the same as or similar to the first and second acoustic wave resonators described above. In Example 1, an acoustic wave filter for Band25Tx was provided. A center frequency is about 1822.5 MHz. Design parameters of the series arm resonators S1, S2-1, S2-2, S3, and S4 and the parallel arm resonators P1 to P3 were set as shown in Table 1 below.

TABLE 1

|  |  | S4 | P3 | S3 | P2 | S2-2 | S2-1 | P1 | S1 |
| --- | --- | --- | --- | --- | --- | --- | --- | --- | --- |
| Number of Pairs of Electrode Fingers of IDT Electrode | Pairs | 144 | 180.5 | 163.5 | 131 | 120 | 120 | 119.5 | 130 |
| Number of Electrode Fingers of Reflector | Number | 21 | 21 | 21 | 21 | 21 | 21 | 21 | 21 |
| Interdigitation Width | μm | 24.3 | 30.2 | 36.4 | 51.4 | 24.1 | 24.1 | 57.3 | 34.9 |
| Duty |  | 0.5 | 0.5 | 0.5 | 0.5 | 0.5 | 0.5 | 0.5 | 0.5 |
| Wavelength | μm | 2.013 | 2.116 | 2.030 | 2.090 | 2.001 | 2.001 | 2.088 | 2.005 |

In the acoustic wave filter of Example 1, the series arm resonator S3 is the first acoustic wave resonator, and the rest of the series arm resonators S1, S2-1, S2-2, S4 and the parallel arm resonators P1 to P3 are defined by the second acoustic wave resonators. The structure of an IDT electrode 5 of each of first and second acoustic wave resonators is the same as or similar to that of the IDT electrode 5 of each of the first and second acoustic wave resonators described above.

The series arm resonator S3 is an acoustic wave resonator having the lowest anti-resonant frequency of the plurality of series arm resonators S1, S2-1, S2-2, S3, and S4.

As Comparative Example 1, the acoustic wave filter of Comparative Example 1 was prepared similarly to Example 1, except that the series arm resonator S3 was also the second acoustic wave resonator.

Figure 6:
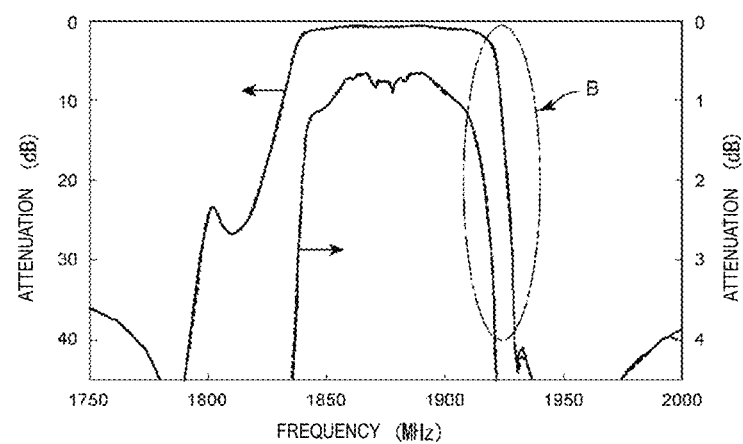
FIG. 6 is a diagram showing attenuation-frequency characteristics of respective acoustic wave filters of Example 1 of a preferred embodiment of the present invention and Comparative Example 1.

In FIG. 6, a solid line indicates attenuation-frequency characteristics of the acoustic wave filter of Example 1, and a broken line indicates attenuation-frequency characteristics of the acoustic wave filter of the Comparative Example 1. Further, FIG. 7 is an enlarged portion showing a portion indicated with a scale of the attenuation on the left side of a portion indicated by the arrow B in FIG. 6.

Figure 7:
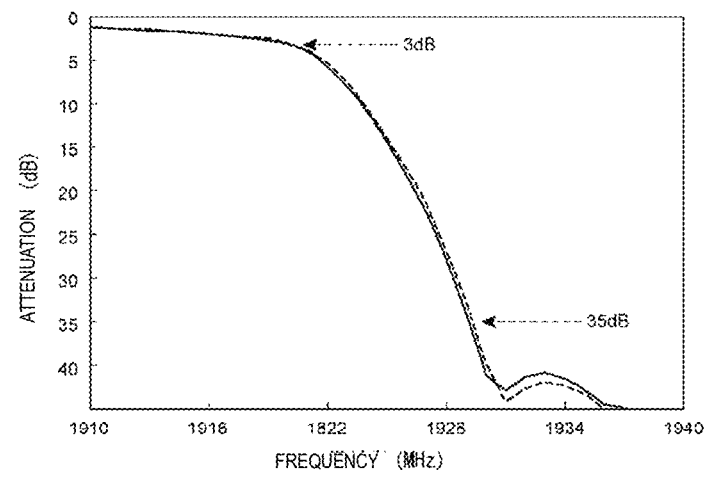
FIG. 7 is an enlarged diagram showing a portion indicated by an arrow B in FIG. 6 and showing attenuation-frequency characteristics of the respective acoustic wave filters of Example 1 and Comparative Example 1.

As is clear from FIG. 6 and FIG. 7, according to the acoustic wave filter of Example 1, steepness of filter characteristics on a high-frequency side of a pass band is increased compared to the acoustic wave filter of Comparative Example 1. To be more specific, steepness from about 3 dB to about dB, which is a frequency range in which the attenuation increases from about 3 dB to about 35 dB, was about 9.3 MHz in Comparative Example 1, whereas about 9.1 MHz in Example 1.

Thus, in the ladder filter of Example 1, since the series arm resonator S3 is the first acoustic wave resonator, the steepness of the filter characteristics can be effectively increased as described above. Further, since the first and second acoustic wave resonators are provided, transverse mode ripples can be reduced or prevented by producing a piston mode. Thus, it can be seen in the acoustic wave filter of Example 1 that it is possible to achieve the reduction or prevention of the transverse mode ripples and the steepness of the filter characteristics, even when a reduction in size is achieved.

Example 2 and Comparative Example 1

As Example 2 of a preferred embodiment of the present invention, a ladder filter of Example 2 was prepared similarly to the ladder filter of Comparative Example 1, except that only the parallel arm resonator P1 was a first acoustic wave resonator. The parallel arm resonator P1 of the ladder filter of Example 2 is defined by the first acoustic wave resonator as described above, and the configuration of the first acoustic wave resonator was similar to that of the first acoustic wave resonator illustrated in FIGS. 5A and 5B described above.

Figure 8:
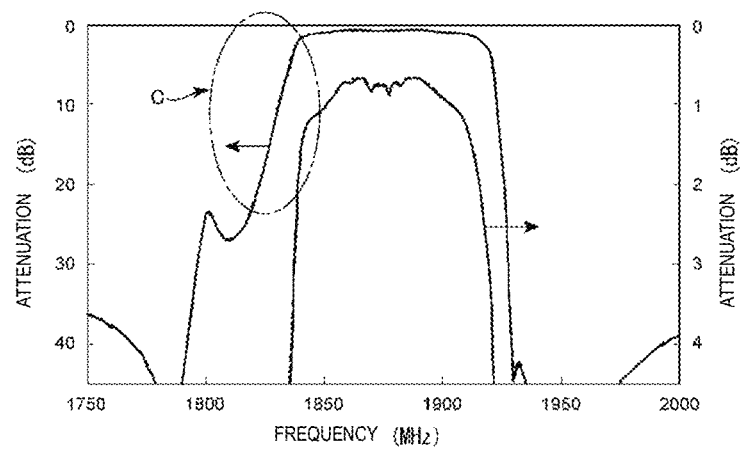
FIG. 8 is a diagram showing attenuation-frequency characteristics of respective acoustic wave filters of Example 2 of a preferred embodiment of the present invention and Comparative Example 1.
Figure 9:
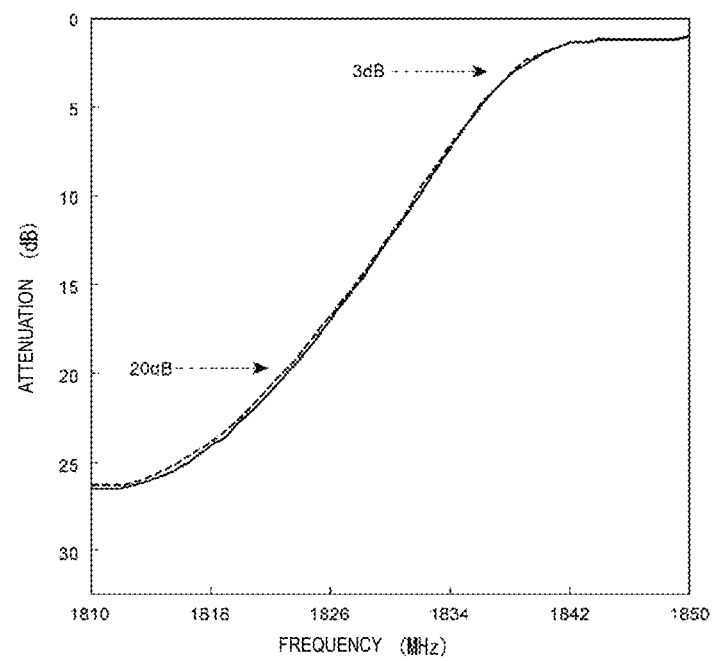
FIG. 9 is an enlarged diagram showing a portion indicated by an arrow C in FIG. 8 and showing attenuation-frequency characteristics of the respective acoustic wave filters of Example 2 and Comparative Example 1.

FIG. 8 is a diagram showing attenuation-frequency characteristics of the respective acoustic wave filters of Example 2 and Comparative Example 1. FIG. 9 is an enlarged diagram showing a portion indicated with a scale of the attenuation on the left side of a portion indicated by the arrow C in FIG. 8. A solid line indicates the characteristics of Example 2, and a broken line indicates the characteristics of Comparative Example 1.

As is clear from FIG. 8 and FIG. 9, in the acoustic wave filter of Example 2, steepness on a low-frequency side of a pass band is increased compared to Comparative Example 1. To be more specific, steepness from about 3 dB to about 20 dB is about 15.2 MHz in Comparative Example 1, whereas about 15.0 MHz in Example 2. The steepness from about 3 dB to about 20 dB is a frequency difference between a frequency at which the attenuation is about 3 dB and a frequency at which the attenuation is about 20 dB.

As shown in Table 1, the parallel arm resonator P1 is an acoustic wave resonator having the highest resonant frequency, of the plurality of parallel arm resonators P1 to P3.

In the acoustic wave filter of Example 2, since the parallel arm resonator P1 is the first acoustic wave resonator as described above, the steepness of the filter characteristics can be effectively increased. Thus, also in Example 2, even when a reduction in size is achieved, reduction or prevention of transverse mode ripples can be effectively achieved, and the steepness of the filter characteristics can be increased.

As in Example 1, a series arm resonator having the lowest anti-resonant frequency of a plurality of series arm resonators having anti-resonant frequencies higher than a center frequency is preferably defined by the first acoustic wave resonator. This is because a series arm resonator having the lowest anti-resonant frequency has the largest influence on steepness on a high-frequency side of a pass band. However, at least one acoustic wave resonator among the other series arm resonators S1, S2-1, S2-2, and S4 may be the first acoustic wave resonator. Thus, the steepness on the high-frequency side of the pass band can be further increased. More preferably, when all of the series arm resonators are defined by the first acoustic wave resonators, the steepness on the high-frequency side of the pass band can be further increased.

On the other hand, as described in Example 2, the parallel arm resonator P1 having the highest resonant frequency of the plurality of parallel arm resonators having resonant frequencies lower than the center frequency is preferably defined by the first acoustic wave resonator. This is because the parallel arm resonator having the highest resonant frequency has the largest influence on the steepness on the low-frequency side of the pass band. However, at least one of the other parallel arm resonators P2 and P3 may be the first acoustic wave resonator. In this case, the steepness on the low-frequency side of the pass band can be further increased.

In an acoustic wave filter including a plurality of series arm resonators and a plurality of parallel arm resonators, the plurality of series arm resonators may include a first acoustic wave resonator and a second acoustic wave resonator, and the plurality of parallel arm resonators may include a first acoustic wave resonator and a second acoustic wave resonator. For example, the configuration of the series arm of Example 1 and the configuration of the parallel arm of Example 2 may be provided. As described above, the arrangement of the first acoustic wave resonator and the second acoustic wave resonator in the plurality of acoustic wave resonators is not particularly limited.

Furthermore, the acoustic wave filter of preferred embodiments of the present invention can be applied, not limited to a ladder filter, but widely to a band-pass filter including a plurality of acoustic wave resonators. For example, preferred embodiments of the present invention may be applied to a series arm resonator and a parallel arm resonator in a band-pass filter in which a series arm resonator and/or a parallel arm resonator is electrically connected to a longitudinally coupled resonator acoustic wave filter.

Figure 10:
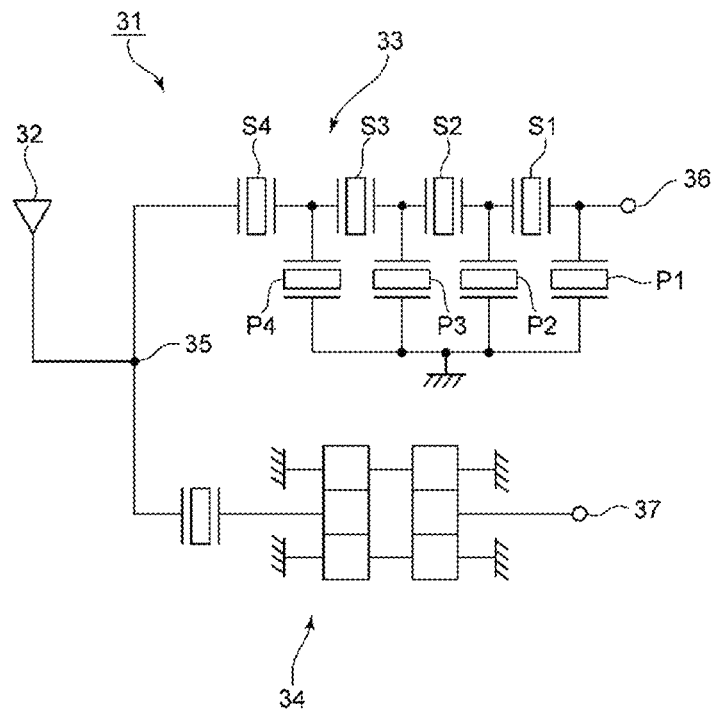
FIG. 10 is a circuit diagram of a duplexer including an acoustic wave filter according to a second preferred embodiment of the present invention.

FIG. 10 is a circuit diagram of a duplexer including an acoustic wave filter according to a second preferred embodiment of the present invention.

In a duplexer 31, an acoustic wave filter 33 of the second preferred embodiment and a longitudinally coupled resonator acoustic wave filter 34 are connected to an antenna terminal 32. The acoustic wave filter 33 is a transmission filter and is connected between a transmission terminal 36 and a common terminal 35. The longitudinally coupled resonator acoustic wave filter 34 is a reception filter. The longitudinally coupled resonator acoustic wave filter 34 is connected between the common terminal 35 and a reception terminal 37. In such a duplexer, when the acoustic wave filter 33 of the second preferred embodiment is used as the transmission filter, transverse mode ripples can be reduced or prevented and steepness of filter characteristics can be increased, even when a reduction in size of the transmission filter is achieved.

In addition, of the plurality of series arm resonators S1 to S4 and parallel arm resonators P1 to P4, an acoustic wave resonator farthest from the antenna terminal 32 is preferably defined by the first acoustic wave resonator. The acoustic wave resonator farthest from the antenna terminal 32 is the series arm resonator S1 of the plurality of series arm resonators S1 to S4 and additionally, is the parallel arm resonator P1 of the parallel arm resonators P1 to P4. At least one of the series arm resonator S1 and the parallel arm resonator P1 is preferably defined by the first acoustic wave resonator. Unlike the second acoustic wave resonator, an acoustic velocity reducing film is not included in the first acoustic wave resonator, and thus, polarization reversal of a piezoelectric film due to stress of an acoustic velocity reducing film is less likely to occur and electric power handling capability is high compared with the second acoustic wave resonator. Thus, by using, as the first acoustic wave resonator, the series arm resonator S1 or the parallel arm resonator P1 closest to the transmission terminal to which large electric power is likely to be applied and to which a load due to voltage is likely to be applied, polarization reversal of the piezoelectric film of the acoustic wave filter 33 can be made to be less likely to occur and electric power handling capability can be increased.

In addition, of the plurality of series arm resonators S1 to S4 and the parallel arm resonators P1 to P4, an acoustic wave resonator closest to the antenna terminal 32 is preferably defined by the first acoustic wave resonator. The acoustic wave resonator closest to the antenna terminal 32 is the series arm resonator S4 of the plurality of series arm resonators S1 to S4. The series arm resonator S4 preferably is defined by the first acoustic wave resonator. When a reduction in size is achieved by increasing duty of the second acoustic wave resonator, there is a problem in that linearity of the duplexer 31 is deteriorated. However, the deterioration of the linearity of the duplexer 31 can be reduced or prevented by using, as the first acoustic wave resonator, the acoustic wave resonator which is closest to the antenna terminal and the linearity of which is most likely to be deteriorated and by setting the duty to be smaller than that of the second acoustic wave resonator.

The acoustic wave filter 33 may be used as a reception filter. In this case, of the plurality of series arm resonators S1 to S4 and parallel arm resonators P1 to P4, an acoustic wave resonator farthest from the antenna terminal 32 is preferably the first acoustic wave resonator. That is, at least one of the series arm resonator S1 and the parallel arm resonator P1 is preferably defined by the first acoustic wave resonator. Unlike the second acoustic wave resonator, an acoustic velocity reducing film is not included in the first acoustic wave resonator, and thus, polarization reversal of a piezoelectric film due to stress of an acoustic velocity reducing film is less likely to occur compared with the second acoustic wave resonator. Thus, by using, as the first acoustic wave resonator, the series arm resonator S1 or the parallel arm resonator P1 closest to the reception terminal to which a load due to voltage is likely to be applied, polarization reversal of the piezoelectric film of the acoustic wave filter 33 can be made to be less likely to occur.

Figure 11:
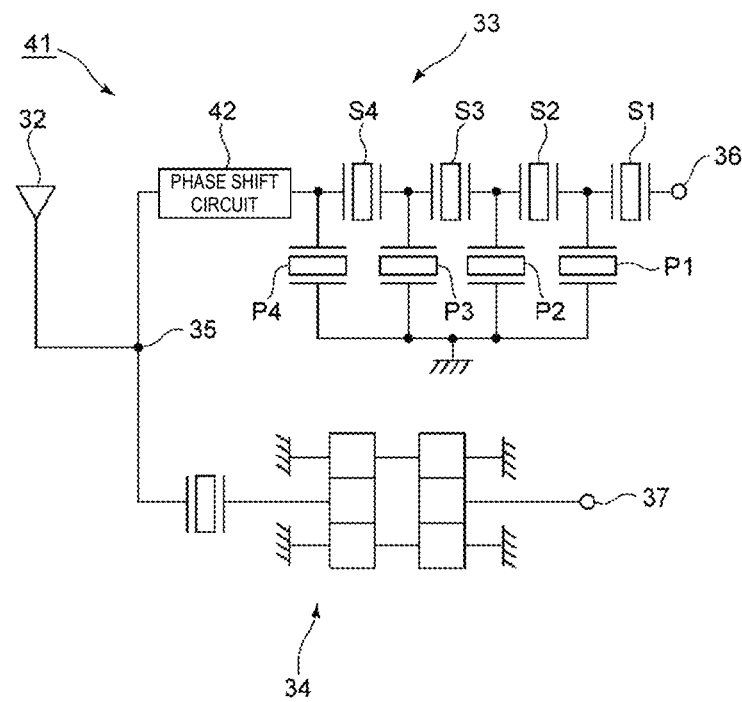
FIG. 11 is a circuit diagram of a duplexer including an acoustic wave filter according to a third preferred embodiment of the present invention.

FIG. 11 is a circuit diagram of a duplexer including an acoustic wave filter according to a third preferred embodiment of the present invention.

In a duplexer 41, a phase shift circuit 42 is connected between the antenna terminal 32 and the acoustic wave filter 33. In the remaining circuit configurations, the duplexer 41 is the same as or similar to the duplexer 31. In the duplexer 41 including such a phase shift circuit 42, the acoustic wave filter of the present preferred embodiment of the present invention may be used as the acoustic wave filter 33.

Figure 12A:
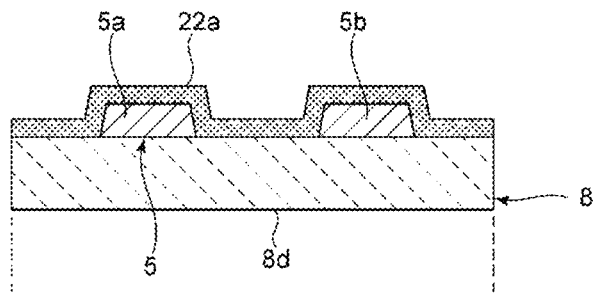
FIG. 12A to FIG. 12D are partial front sectional views for explaining modified examples of electrode structure of the second acoustic wave resonator.

FIGS. 12A to 12D are partial front sectional views for explaining modified examples of electrode structure of the second acoustic wave resonator. FIG. 12A illustrates a section along an acoustic wave propagation direction and passing through the second edge region E2 of the acoustic wave resonator illustrated in FIG. 4. As described above, the acoustic velocity reducing film 22a is provided so as to extend in the acoustic wave propagation direction in the second edge region.

Figure 12B:
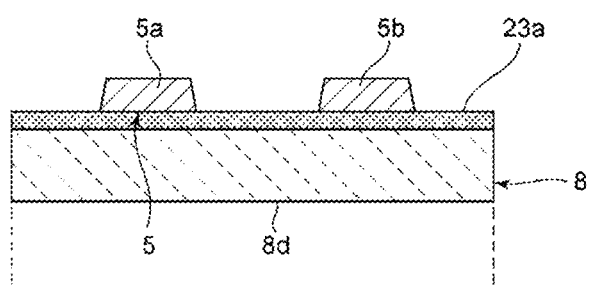
Figure 12C:
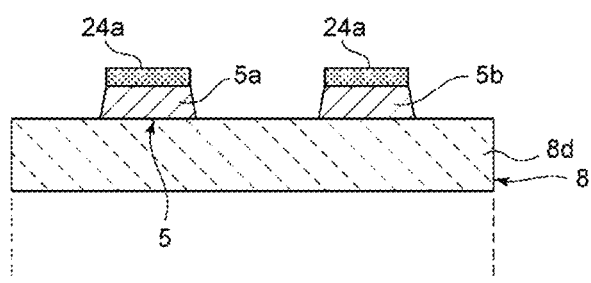

As illustrated in FIG. 12B, an acoustic velocity reducing film 23a may be provided between the first and second electrode fingers 5a and 5b and the piezoelectric film 8d in the first and second edge regions. Alternatively, as illustrated in FIG. 12C, an acoustic velocity reducing film 24a may be laminated on the first electrode fingers 5a and the second electrode fingers 5b. In this case, a metallic material or the like may be used as the acoustic velocity reducing film 24a.

Figure 12D:
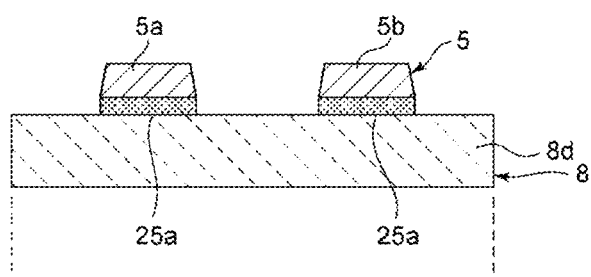

Further, as illustrated in FIG. 12D, an acoustic velocity reducing film 25a may be laminated between the first and second electrode fingers 5a and 5b and the piezoelectric film 8d. In this case, a metallic material or the like may be used as the acoustic velocity reducing film 25a.

As illustrated in FIGS. 12A and 12C, when, for example, silicon oxide is provided on the first and second electrode fingers 5a and 5b, silicon oxide defines and functions as an acoustic velocity reducing film. On the other hand, as illustrated in FIGS. 12B and 12D, when, for example, silicon oxide is provided under the first and second electrode fingers 5a and 5b, silicon oxide defines and functions as an acoustic velocity increasing film.

As described above, the acoustic velocity reducing film in the second acoustic wave resonator can be provided in the first and second edge regions in various configurations, and the configuration is not particularly limited.

Figure 13:
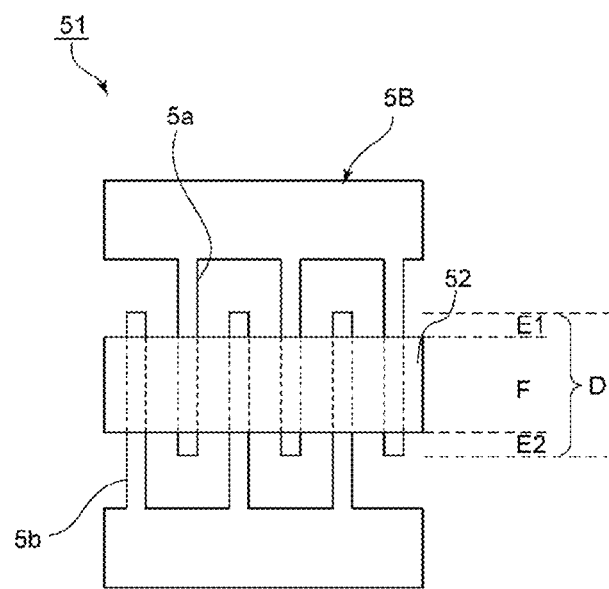
FIG. 13 is a plan view illustrating an IDT electrode of a second acoustic wave resonator used in an acoustic wave filter according to a fourth preferred embodiment of the present invention.

Further, FIG. 13 is a plan view illustrating electrode structure 51 of a second acoustic wave resonator used in an acoustic wave filter according to a fourth preferred embodiment of the present invention. Here, an acoustic velocity increasing film is laminated so as to cover the first and second electrode fingers 5a and 5b in the central region F of the intersecting region D. By providing the acoustic velocity increasing film 52 in the central region F, an acoustic velocity in the central region F can be increased. As described above, an acoustic velocity increasing film may be provided in the central region F. In this case, the acoustic velocity increasing film 52 may be laminated between the first and second electrode fingers 5a and 5b and the piezoelectric film 8d.

Examples of a material capable of defining and functioning as the acoustic velocity increasing film 52 above include $Al_2O_3$, AlN, SiN, $SiO_x$, and the like.

Additionally, the acoustic velocity increasing film 52 described above and an acoustic velocity reducing film may be used in combination. That is, the acoustic velocity reducing film may be provided in the first and second edge regions, and the acoustic velocity increasing film 52 may be provided in the central region.

The first acoustic wave resonator and the second acoustic wave resonator described above may be provided on the same piezoelectric substrate. Alternatively, a piezoelectric substrate of the first acoustic wave resonator and a piezoelectric substrate of the second acoustic wave resonator may be different piezoelectric substrates.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter, comprising:
   a plurality of acoustic wave resonators including a piezoelectric substrate, and an IDT electrode on the piezoelectric substrate and including first and second electrode fingers interdigitated with each other; wherein
   a region in which the first electrode fingers and the second electrode fingers overlap each other in an acoustic wave propagation direction is defined as an intersecting region;
   the intersecting region includes a central region at a center or approximate center in a direction in which the first and second electrode fingers extend and first and second edge regions on respective outer side portions of the central region in a direction in which the first and second electrode fingers extend, and an acoustic velocity in the first and second edge regions is lower than an acoustic velocity in the central region; and
   the plurality of acoustic wave resonators include:
      a first acoustic wave resonator in which at least one of a width of the first electrode fingers and a width of the second electrode fingers in the first and second edge regions is larger than at least one of a width of the first electrode fingers and a width of the second electrode fingers in the central region; and
      a second acoustic wave resonator including at least one of a configuration in which an acoustic velocity reducing film is laminated in the first and second edge regions and a configuration in which an acoustic velocity increasing film to increase the acoustic velocity is laminated in the central region.

2. An acoustic wave filter, comprising
   a plurality of acoustic wave resonators including a piezoelectric substrate and an IDT electrode on the piezoelectric substrate and including first and second electrode fingers interdigitated with each other; wherein
   a region in which the first electrode fingers and the second electrode fingers overlap each other in an acoustic wave propagation direction is defined as an intersecting region;
   the intersecting region includes a central region at a center or approximate center in a direction in which the first and second electrode fingers extend and first and second edge regions on respective outer side portions of the central region in a direction in which the first and second electrode fingers extend, and an acoustic velocity in the first and second edge regions is lower than an acoustic velocity in the central region; and
   the plurality of acoustic wave resonators include:
      a first acoustic wave resonator in which at least one of a width of the first electrode fingers and a width of the second electrode fingers in the first and second edge regions is larger than at least one of a width of the first electrode fingers and a width of the second electrode fingers in the central region; and
      a second acoustic wave resonator including at least one of a configuration in which an insulating film made of tantalum pentoxide, hafnium oxide, niobium pentoxide, tungsten oxide, and silicon oxide, or Al, Cu, Pt, Au, Ag, Ti, Ni, Cr, Mo, W, Ta, Mg, Fe, or Ru or alloy mainly including Al, Cu, Pt, Au, Ag, Ti, Ni, Cr, Mo, W, Ta, Mg, Fe, or Ru is laminated in the first and second edge regions and a configuration in which a film made of aluminum oxide, aluminum nitride, silicon nitride, or silicon oxide is laminated in the central region.

3. The acoustic wave filter according to claim 1, wherein a duty in the central region of the IDT electrode in the second acoustic wave resonator is larger than a duty in the central region of the IDT electrode in the first acoustic wave resonator.

4. The acoustic wave filter according to claim 1, wherein the plurality of acoustic wave resonators include a series arm resonator and a parallel arm resonator.

5. The acoustic wave filter according to claim 4, wherein the series arm resonator includes a plurality of series arm resonators, and the parallel arm resonator includes a plurality of parallel arm resonators.

6. The acoustic wave filter according to claim 5, wherein the acoustic wave filter is a ladder filter.

7. The acoustic wave filter according to claim 6, wherein of a plurality of the series arm resonators having an anti-resonant frequency higher than a center frequency of a pass band of the ladder filter, a series arm resonator having a lowest anti-resonant frequency is the first acoustic wave resonator.

8. The acoustic wave filter according to claim 6, wherein of a plurality of the parallel arm resonators having a resonant frequency lower than a center frequency of a pass band of the ladder filter, a parallel arm resonator having the highest resonant frequency is the first acoustic wave resonator.

9. The acoustic wave filter according to claim 5, further comprising:
   a common terminal; wherein
   of a plurality of the series arm resonators, a series arm resonator closest to the common terminal is the first acoustic wave resonator.

10. The acoustic wave filter according to claim 1, wherein the acoustic wave filter is a transmission filter including an antenna terminal and a transmission terminal; and
    of the plurality of acoustic wave resonators, an acoustic wave resonator farthest from the antenna terminal is the first acoustic wave resonator.

11. The acoustic wave filter according to claim 1, wherein the acoustic wave filter is a reception filter including an antenna terminal and a reception terminal; and
    of the plurality of acoustic wave resonators, an acoustic wave resonator farthest from the antenna terminal is the first acoustic wave resonator.

12. The acoustic wave filter according to claim 1, wherein the plurality of acoustic wave resonators further include an acoustic wave resonator having a structure different from that of the first acoustic wave resonator and the second acoustic wave resonator.

13. The acoustic wave filter according to claim 4, further comprising a longitudinally coupled resonator acoustic wave filter electrically connected to the series arm resonator or the parallel arm resonator.

14. The acoustic wave filter according to claim 1, wherein the first acoustic wave resonator and the second acoustic wave resonator are provided on one piezoelectric substrate.

15. The acoustic wave filter according to claim 1, wherein
the piezoelectric substrate includes a high acoustic velocity material layer and a piezoelectric film directly or indirectly laminated on the high acoustic velocity material layer; and
the high acoustic velocity material layer is made of a high acoustic velocity material in which an acoustic velocity of a bulk wave propagating therethrough is higher than acoustic velocity of an acoustic wave propagating through the piezoelectric film.

16. The acoustic wave filter according to claim 15, wherein
a low acoustic velocity film is laminated between the high acoustic velocity material layer and the piezoelectric film; and
an acoustic velocity of a bulk wave propagating through the low acoustic velocity film is lower than acoustic velocity of a bulk wave propagating through the piezoelectric film.

17. The acoustic wave filter according to claim 15, wherein a support substrate is laminated on a side of the high acoustic velocity material layer opposite to the piezoelectric film.

18. The acoustic wave filter according to claim 15, wherein the high acoustic velocity material layer is a support substrate made of a high acoustic velocity material.

* * * * *